United States Patent
Hamada et al.

(10) Patent No.: US 7,154,219 B2
(45) Date of Patent: Dec. 26, 2006

(54) ORGANIC ELECTROLUMINESCENCE DISPLAY WITH ADJACENT BLOCKS OF LUMINESCENT LAYER

(75) Inventors: Yuji Hamada, Nara (JP); Kazuki Nishimura, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/931,528

(22) Filed: Sep. 1, 2004

(65) Prior Publication Data

US 2005/0088104 A1 Apr. 28, 2005

Related U.S. Application Data

(63) Continuation of application No. PCT/JP2003/02532, filed on Mar. 5, 2003.

(30) Foreign Application Priority Data

Mar. 5, 2002 (JP) ............................. 2002-059539

(51) Int. Cl.
*H05B 33/02* (2006.01)
(52) U.S. Cl. ..................... 313/506; 313/504; 313/505
(58) Field of Classification Search ................ 313/504, 313/505, 506, 509, 512
See application file for complete search history.

(56) References Cited

U.S. PATENT DOCUMENTS

| | | | |
|---|---|---|---|
| 6,246,179 B1 | 6/2001 | Yamada | |
| 6,911,774 B1* | 6/2005 | Arakawa et al. | 313/506 |
| 2001/0045565 A1* | 11/2001 | Yamazaki | 257/89 |
| 2002/0084746 A1* | 7/2002 | Anzai | 313/504 |
| 2003/0006699 A1* | 1/2003 | Ogino et al. | 313/506 |
| 2003/0017258 A1* | 1/2003 | Yamada et al. | 427/66 |
| 2003/0168972 A1* | 9/2003 | Hamada et al. | 313/504 |

FOREIGN PATENT DOCUMENTS

| | | |
|---|---|---|
| JP | 03-250583 | 11/1991 |
| JP | 11-191489 | 7/1999 |
| JP | 11-214157 | 8/1999 |
| JP | 11-307268 | 11/1999 |
| JP | 2000-228284 | 8/2000 |
| JP | 2001-175200 | 6/2001 |
| JP | 2001-256687 | 9/2001 |
| JP | 2002-015866 | 1/2002 |
| JP | 2002-151269 | 5/2002 |
| JP | 2002-216955 | 8/2002 |
| JP | 2002-244590 | 8/2002 |
| KR | 2000-47776 | 7/2000 |
| KR | 2000-47778 | 7/2000 |
| WO | WO99/46748 | 9/1999 |

* cited by examiner

*Primary Examiner*—Nimeshkumar D. Patel
*Assistant Examiner*—Matt Hodges
(74) *Attorney, Agent, or Firm*—Fish & Richardson P.C.

(57) ABSTRACT

A boundary region between blocks of a luminescent layer is provided in a region on a second insulating layer (18) parallel with a glass substrate. Blocks of an electron transporting layer (28) are formed on associated blocks of the luminescent layer. A lithium fluoride layer (30) and an electron injection layer (32) are successively formed on the electron transporting layer (28) seamlessly. Accordingly, a boundary between the blocks of the electron transporting layer (28) is vertically aligned with a boundary between the blocks of the luminescent layer.

6 Claims, 5 Drawing Sheets

FIG.4

|  | DURATION OF LIGHT EMISSION: 0 HOURS | 100 HOURS | 500 HOURS |
|---|---|---|---|
| RED | PROPORTIONAL LUMINANCE 100% | 95% | 89% |
| GREEN | 100% | 96% | 91% |
| BLUE | 100% | 95% | 90% |

ORGANIC ELECTROLUMINESCENCE DISPLAY WITH ADJACENT BLOCKS OF LUMINESCENT LAYER

This is a continuation of International Application PCT/JP2003/002532, filed Mar. 5, 2003.

TECHNICAL FIELD

The present invention relates to an organic electroluminescence display apparatus provided with a plurality of organic electroluminescence devices and a method of manufacturing the same.

BACKGROUND ART

Organic electroluminescence display apparatuses (hereinafter, simply referred to as organic EL display apparatuses) are expected to replace liquid crystal display apparatuses, which are widely used today, and have been developed and made commercially available. Particularly, an active matrix organic EL display apparatus provided with a thin film transistor (TFT) as a switching device is considered to play a key role in a next-generation flat-panel display apparatus.

An organic electroluminescence device (hereinafter, simply referred to as organic EL device) provided in an organic EL display apparatus is constructed such that electrons and holes are injected into a luminescent layer from an electron injection electrode and a hole injection electrode, respectively. The electrons and holes are recombined at an interface between the luminescent layer and a hole-transporting layer or inside the luminescent layer in the neighborhood of the interface so that organic molecules are placed in an excited state. When the organic molecules are returned from the excited state to the ground state, fluorescent light is produced.

Generally, vacuum evaporation is used to manufacture an organic EL device. Unlike a liquid crystal display apparatus, an organic EL device of an organic EL display apparatus is itself a source of light of a specific color such as red, green and blue. Accordingly, a substrate should be patterned so as to form an organic EL device producing a desired color in a desired region. In a generally practiced method, a mask formed of a metal plate or the like provided with an opening is placed on a substrate. An evaporated material from a source of evaporation is selectively deposited on the substrate via the opening.

The mask for forming an organic EL device producing light of a desired color in a desired region on the substrate may be misaligned with the target region. As a result of misalignment of the mask, the luminescent layer may be formed in a region displaced from the target region. Consequently, the light-emitting region may be narrowed, the aperture for pixels may be narrowed and the yield of products may be lowered. Displacement of an organic EL device may cause a broken wire or a short circuit.

DISCLOSURE OF THE INVENTION

One mode of practicing the present invention is an organic EL display apparatus. The organic electroluminescence display apparatus, provided with a plurality of organic electroluminescence devices formed to be adjacent to each other, is characterized in that a boundary between blocks of a luminescent layer of the organic electroluminescence devices is vertically aligned with a region constructed as a separation between pixels each including the organic electroluminescence devices. A region constructed as a separation between pixels may be, for example, a scan line, a power supplying line and a TFT provided in an organic EL display apparatus.

Another mode of practicing the present invention is also an organic EL display apparatus. The organic electroluminescence display apparatus, provided with a plurality of organic electroluminescence devices formed to be adjacent to each other, is characterized in that an active element formed on a substrate and driving the organic electroluminescence devices, a first insulating layer formed to cover the substrate and the active element, an anode formed at a predetermined region in the first insulating layer, a second insulating layer formed above the active element and in a predetermined region on the first insulating layer and the anode, a hole transporting layer formed to cover the first insulating layer, the anode and the second insulating layer, and a luminescent layer comprising blocks adjacent to each other, formed in a predetermined region on the hole transporting layer are formed in the stated order one upon another, and a first boundary between the adjacent blocks of the luminescent layer is provided on the second insulating layer.

For example, the substrate may be formed of a transparent and insulating material such as glass or acrylic resin. The active element may be an element of a metal insulator metal (MIM) structure or a TFT.

An electron transporting layer may be formed on the luminescent layer such that a second boundary between adjacent blocks of the electron transporting layer is vertically aligned with the first boundary. The active element may be a TFT.

Generally, after TFTs and wiring are provided on a substrate formed of glass, a first insulating layer is formed on the entirety thereof, using a transparent and insulating material such as acrylic resin. A hole transporting layer, an anode, is then formed in a predetermined region. The anode is connected to the wiring in the insulating layer via a contact hole provided in the first insulating layer.

Further, a second insulating layer is locally formed above a region in which the TFT is formed, and on the first insulating layer and the anode, thus completing the manufacturing of a TFT substrate on which organic EL devices are to be formed. A hole transporting layer is formed on the entirety of the TFT substrate. Subsequently, a luminescent layer producing red, green and blue lights and including organic EL devices is formed in a predetermined region. When the luminescent layer is formed using the vacuum evaporation method, a metal mask is used so that blocks of the luminescent layer are successively and selectively formed in predetermined regions. In this process, the position of mask is adjusted so that a boundary between the adjacent blocks of the luminescent layer is located on the second insulating layer so as to be parallel with the glass substrate.

The light produced by the luminescent layer is projected outside via the glass substrate. The TFT is located between the second insulating layer and the glass substrate and prevents the light from being transmitted. The light emitting region of a pixel is a region in which the second insulating layer is not formed. By providing the boundary between adjacent blocks of the luminescent layer in the region where the TFT is provided, adverse effects on light emission occurring when the boundary is displaced are reduced. For example, when the boundary between adjacent blocks of the luminescent layer is provided in the boundary region of the second insulating layer, adverse effects such as narrowing of the display region and aperture, and mixture of displayed colors may be invited. The resultant product may not have an expected quality. That is, the yield of products may drop. Ensuring that the second boundary, the boundary between the adjacent blocks of the electron transporting layer, is vertically aligned with the first boundary, the boundary between the adjacent blocks of the luminescent layer, produces favorable effects in the manufacturing process in that the luminescent layer and the electron transporting layer may be formed in succession.

Another mode of practicing the present invention is a method of manufacturing an organic EL display apparatus. The method of manufacturing an organic electroluminescence display apparatus, provided with a plurality of organic electroluminescence devices formed to be adjacent to each other, comprises the steps of: forming an active element driving the organic electroluminescence devices on a predetermined region of a substrate; forming a first insulating layer to cover the substrate and the active element; forming an anode at a predetermined region in the first insulating layer; forming a second insulating layer above the active element and in a predetermined region on the first insulating layer and the anode; forming a hole transporting layer to cover the first insulating layer, the second insulating layer, and the anode; forming a luminescent layer comprising blocks adjacent to each other, in a predetermined region on the hole transporting layer, characterized in that a first boundary between the adjacent blocks of the luminescent layer is provided on the second insulating layer.

An electron transporting layer may be seamlessly formed on the blocks of the luminescent layer. The electron transporting layer for the organic EL devices may be formed on the luminescent layer such that a second boundary between adjacent blocks of the electron luminescent layer is vertically aligned with the first boundary. The step of forming the luminescent layer and the step of forming the electron transporting layer may be performed successively for a pixel producing a given color. The active element may be a TFT.

As described, when an apparatus using organic EL devices is manufactured according to the related art, red, green and blue layers of a luminescent layer are successively and selectively formed in predetermined regions of a substrate, using masks. Subsequently, an electron transporting layer is formed on the luminescent layer, using masks for a second time. With this method, the first boundary between the individual layers of the luminescent layer may be displaced from the second boundary between adjacent blocks of the electron transporting layer. In the present invention, the displacement is avoided by forming a red layer of the luminescent layer, for example, and then forming an associated block of the electron transporting layer in succession, while maintaining the mask in its position. The green and blue layers of the luminescent layer, and the associated blocks of the electron transporting layer are similarly formed.

A light emission scheme known as a top emission scheme is known in an organic electroluminescence display apparatus. In this scheme, light emission is toward the top of the structure instead of the glass substrate. In an organic electroluminescence display apparatus of this scheme, the layered structure above the active element may be reversed to the structure described above. In this case, the cathode formed as an electron injection electrode, the electron transporting layer, the luminescent layer, the hole transporting layer and the anode are built on the active element in the stated order. In this structure, the second insulating layer covers the cathode instead of the anode.

Another mode of practicing the present invention is an organic electroluminescence display apparatus. The organic electroluminescence display apparatus, provided with a plurality of organic electroluminescence devices formed to be adjacent to each other, is characterized in that an active element formed on a substrate and driving the organic electroluminescence devices, a first insulating layer formed to cover the substrate and the active element, an electrode formed in a predetermined region of the first insulating layer so as to have a contact portion in contact with the active element, and a second insulating layer formed above the active element to cover the first insulating layer, the periphery of the electrode and the contact portion are formed one upon another.

BRIEF DESCRIPTION OF THE DRAWINGS

The aforementioned and other objectives, characteristics and advantages will be made more obvious with reference to the preferred embodiment described in the following and the accompanying drawings listed below.

FIG. 4 shows a time-dependent change in the luminance of three organic EL devices producing red, green and blue lights, respectively.

BEST MODE OF PRACTICING THE INVENTION

An object of the embodiment of the present invention is to provide a technology in which adverse effects occurring in manufacturing an organic EL display apparatus due to displacement of an organic EL device from a target region are eliminated so that the yield of products is improved.

In the embodiment of the present invention, the boundary between organic EL devices for adjacent pixels in an active matrix organic EL display apparatus is appropriately set. The boundary is provided in a region not affecting the display of pixels.

Figure 1:
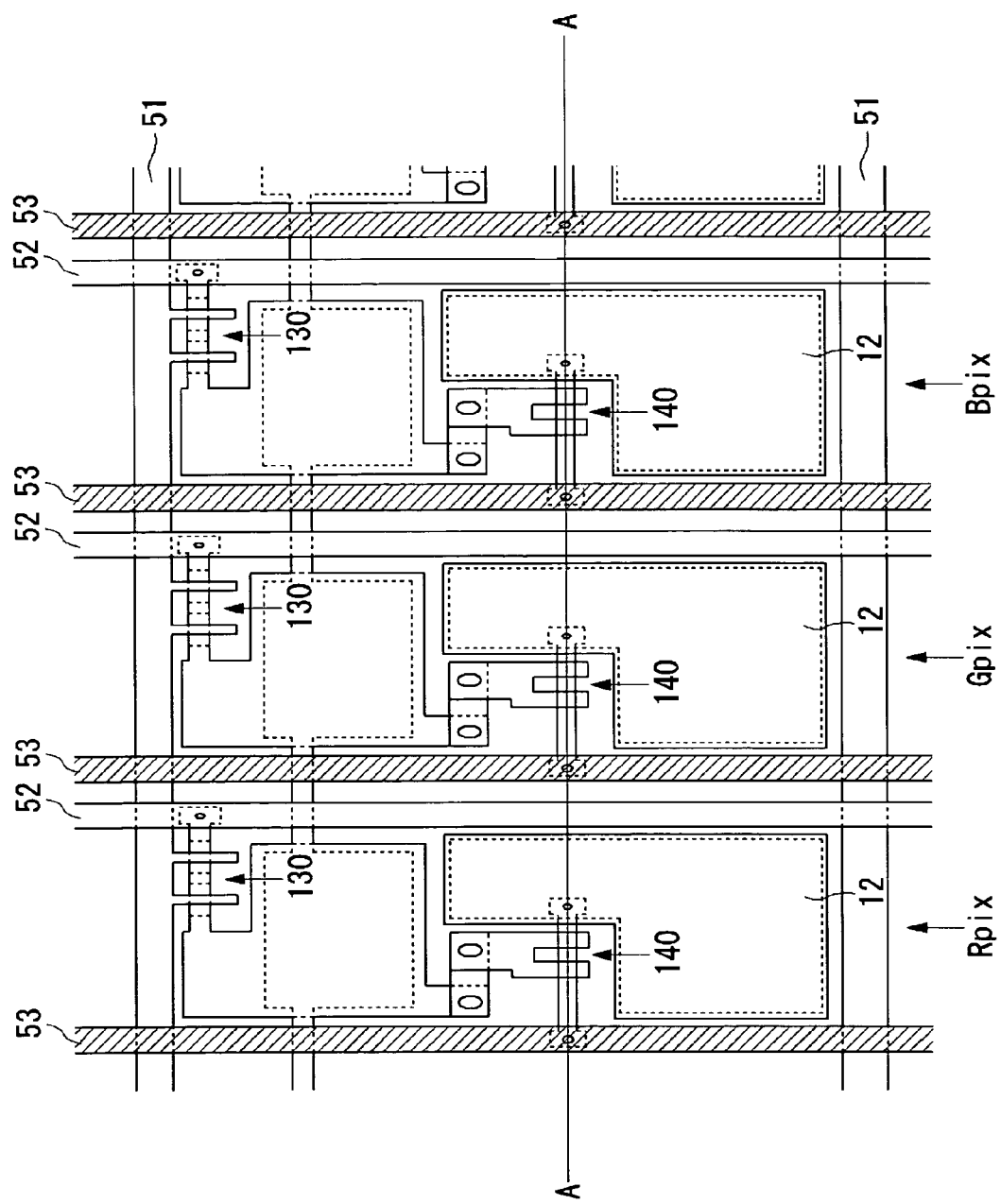
FIG. 1 is a plan view of an active matrix organic EL display apparatus showing, in particular, regions of three pixels including a red pixel, a green pixel and a blue pixel.

FIG. 1 is a schematic plan view of pixel regions for three colors in an organic EL display apparatus provided with organic EL devices producing red, green or blue lights at respective pixels. A red pixel Rpix provided with a red luminescent layer is provided at the far left, followed by a green pixel Gpix provided with a green luminescent layer and a blue pixel Bpix provided with a blue luminescent layer.

The construction of the pixels in the plan view is the same. A pixel is formed in a region bounded by a gate signal line 51 and a drain signal line 52. A first TFT 130, a switching device, is provided in the vicinity of the upper left intersection of the signal lines, and a second TFT 140 for driving the organic EL device is formed in the vicinity of the center of the bounded region. Organic EL devices are formed as islands in a region in which a hole injection electrode 12 formed of indium tin oxide (ITO) is formed.

Figure 2:
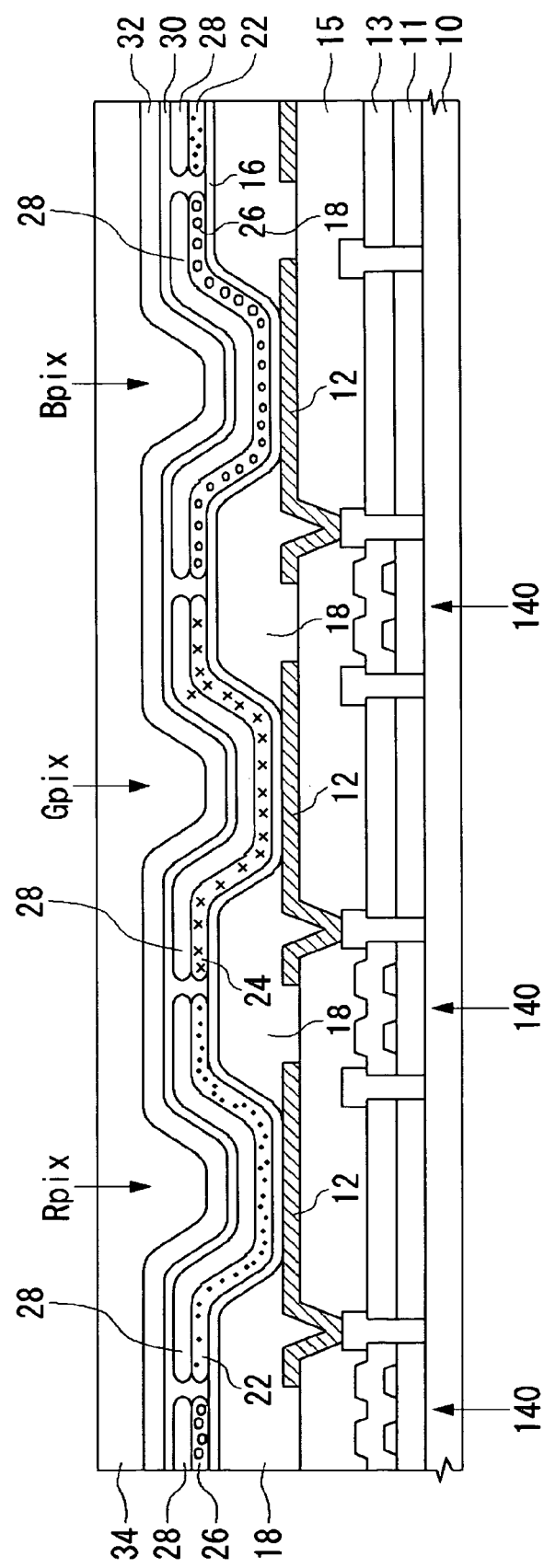
FIG. 2 is a section view showing a construction of an organic EL display apparatus producing red, green and blue lights according to the embodiment.

FIG. 2 is a section view taken A—A of FIG. 1 showing a construction of the organic EL display apparatus provided with red, green and blue pixels according to the embodiment.

An active layer 11 is formed on a glass substrate 10. A portion of the active layer 11 is formed as a second TFT 140 necessary to drive the organic EL devices. An insulating film 13 and a first insulating layer 15 are formed on the active layer 11. On top of the first insulating layer 15 are formed a transparent hole injection electrode 12 and a second insulating layer 18.

The material forming the hole injection electrode 12 may be tin oxide ($SnO_2$) or oxidation indium ($In_2O_3$) instead of ITO. The material forming the first insulating layer 15 may be acryl resin.

The second TFT 140 is formed beneath the second insulating layer 18. The second insulating layer 18 is not formed on the entirety of the hole injection electrode 12 but is formed such that a region in which the second TFT 140 is formed is covered, and the configuration of the second insulating layer 18 does not cause a broken wire in the hole injection electrode 12 and in the film layers described later. Concentration of electric field occurring in the periphery of the hole injection electrode 12, particularly where the edges thereof are exposed, may cause a short circuit. Therefore, the second insulating layer 18 is formed to cover the periphery of the hole injection electrode 12 and a contact portion of the hole injection electrode 12 having a V-shaped configuration as illustrated.

A hole transporting layer 16 is formed to cover the hole injection electrode 12 and the second insulating layer 18. A red block 22 of the luminescent layer, a green block 24 of the luminescent layer and a blue block 26 of the luminescent layer are formed in predetermined regions.

For example, the hole transporting layer 16 may be formed of 1) N,N'-Di(naphthalene-1-yl)-N,N'-diphenyl-benzidine, 2) 4,4',4"-tris(3-methylphenylphenylamino)triphenylamine (MTDATA), or 3) N,N'-diphenyl-N,N'-di(3-methylphenyl)-1,1'-biphenyl-4,4'-diamine.

A chelate-metal complex, such as an aluminum quinoline complex (Alq3) or a bis(benzoquinolinolato) berylium complex (BeBq2). in which a plurality of ligands are coordinated to a signle metal ion are widely used as a host material for the red block 22 and the green block 24.

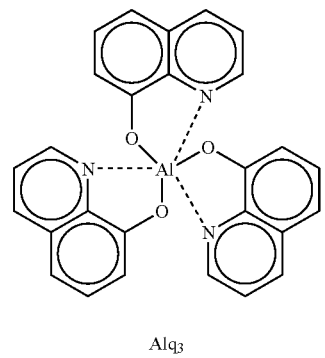

Alq₃

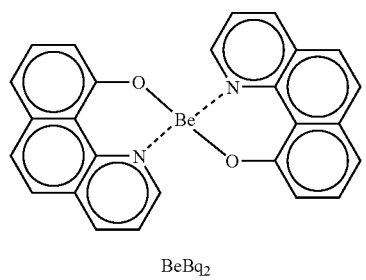

BeBq₂

Generally, an organic EL device in which a chelate-metal complex is used as a material for forming a luminescent layer has a problem with blue luminescence. Therefore, aceton and its derivatives, such as tert-butyl-substituted-dinaphtyl-anthracene indicated by the formula below disclosed in Japanese Laid-Open Patent Application No. 2002-255770, or distyrylbenzene and its derivatives may be used as a host.

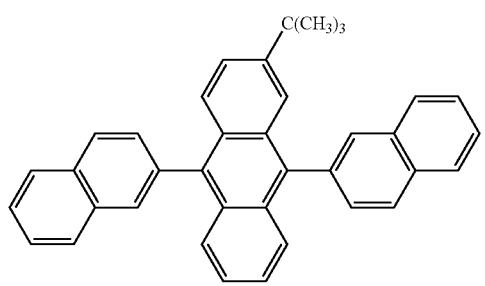

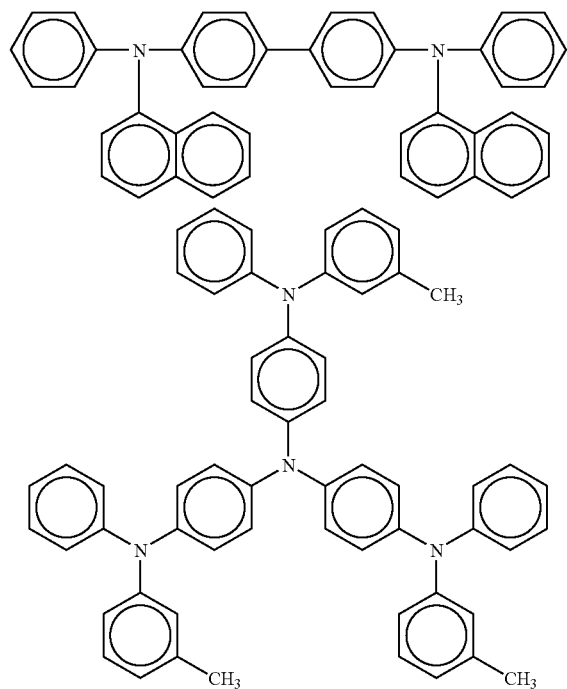

MTDATA

By doping the host formed of a chelate-metal complex or a condensed polycyclic aromatic compound with a dopant such as rubrene, a desired luminescence profile is obtained,

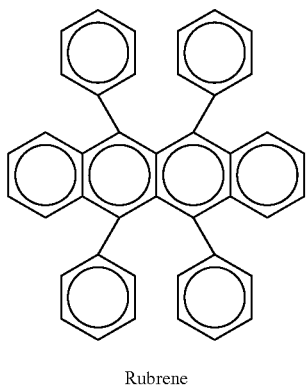

Rubrene

Boundary regions between the blocks of the luminescent layer are provided on the surface of the second insulating layer 18 parallel with the glass substrate. Blocks of electron transporting layer 28 independent of each other are formed on the respective blocks of the luminescent layer. The electron transporting layer 28 may be formed of a chelate-metal complex such as Alq3 or BeBq2. A lithium fluoride layer 30 and an electron injection layer 32 are successively formed to cover the entirety of the electron transporting layer 28 seamlessly. Accordingly, the boundaries created between the adjacent blocks of the electron transporting layer 28 are vertically aligned with the associated boundaries created between the associated blocks of the luminescent layer. For example, aluminum, aluminum alloy which includes a small amount of lithium, magnesium indium alloy, or magnesium silver alloy may be used to form the electron injection electrode 32. The electron injection electrode 32 may be of a two-layer structure in which a lithium fluoride layer is provided adjacent to the electron transporting layer 28 and an aluminum layer is formed above the lithium fluoride layer.

Figure 3A:
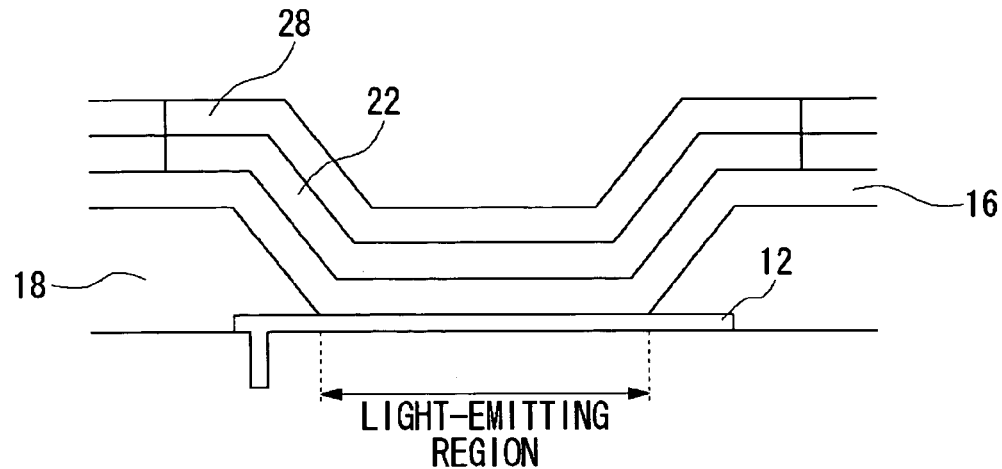
FIG. 3 is a schematic section view of an organic EL device.
Figure 3B:
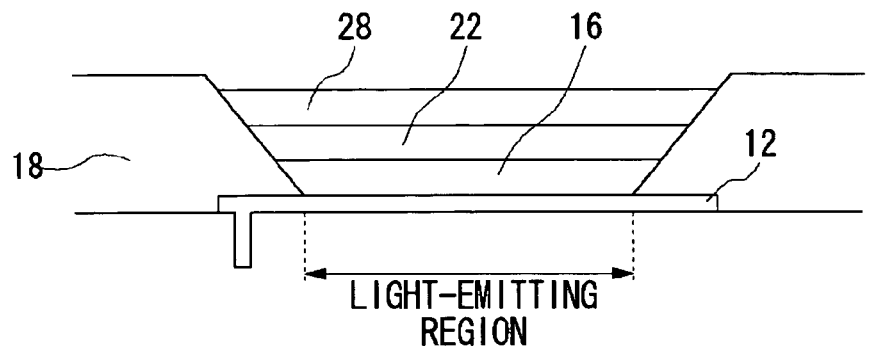
Figure 3C:
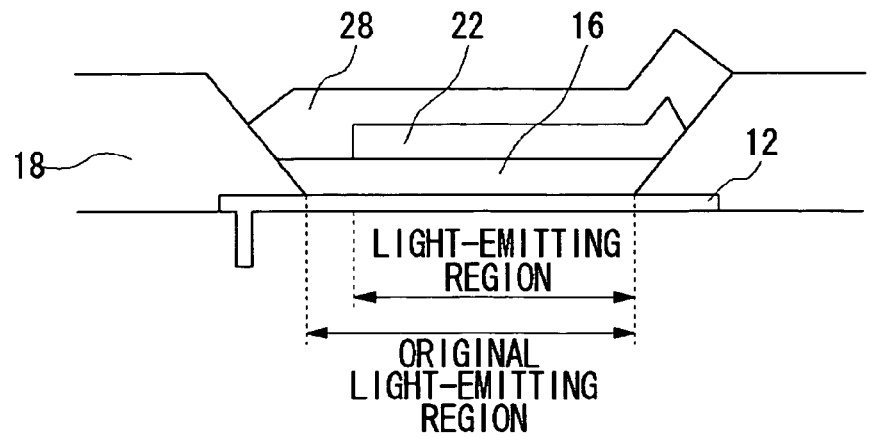

FIG. 3 is a schematic section view of an organic EL device having a structure characteristic to the present invention and an organic EL device having a related-art structure. Organic EL devices provided with the red luminescent layer 22 are illustrated as examples. For brevity of description, portions of the construction shown in FIG. 2 are omitted. FIG. 3(*a*) shows a structure characteristic to the present invention in which the red luminescent layer 22 is formed such that the border thereof extends to the top of the second insulating layer 18. Since the red block 22 of the luminescent layer and the electron transporting layer 28 are formed to be larger than an actual light-emitting region, the light-emitting region is not narrowed if the position of the layers above is more or less displaced.

FIG. 3(*b*) shows a related-art structure in which the red block 22 of the luminescent layer is formed above the light-emitting region with substantially the same extension. FIG. 3(*c*) shows a case occurring in manufacturing the organic EL device according to the related-art structure, in which the position at which the red block 22 of the luminescent layer is formed is displaced from a target region as a result of misalignment of the mask. As shown, a minor displacement in the position at which the red block 22 of the luminescent layer is formed in the related-art structure causes the light-emitting region to be narrowed. Since this displacement is caused by misalignment of the mask, the luminance of red is decreased in the entirety of the display apparatus so that white balance of the display apparatus suffers. The apparatus with such a defect is improper as a product, resulting in the yield of products being decreased.

A discussion will be given of white balance of the display apparatus. In the display apparatus, reproducibility of white is important. The color temperature of reference white in the National Television System Committee (NTSC) standard, a broadcasting scheme for color television, is 6740K of a C illuminant, the CIE standard illuminant. In the case of a display apparatus for computers, the color temperature is higher. Generally, a color temperature from 6000K to 10000K is required. The color temperature of white is represented by a combination of red, green and blue. For example, given that the chromaticity coordinates (X, Y) of organic EL luminescence are (0.65, 0.34) for red, (0.30, 063) for green, and (0.17, 0.17) for blue, the proportional luminance of R:G:B=0.25:0.46:0.29 is required in order to achieve the NTSC white of 6740K at the proportional luminance of (0.31, 0.32).

In order to improve the reproducibility of white in a display apparatus, the above proportional luminance should be maintained. Therefore, the material and device structure that minimize a variation in the proportional luminance even when the display apparatus is continuously in operation are necessary. In the related-art organic EL device, the life of an organic EL device varies from color to color. Accordingly, there has been a problem in that purity of white is lost from coloration as time elapses even when white balance of a display apparatus is established in the manufacturing stage.

FIG. 4 shows a time-dependent change in the luminance of organic EL devices producing three colors in which the red block 22 of the luminescent layer, the green block 24 of the luminescent layer and the blue block 26 of the luminescent layer are formed of the materials described below. The red block of the luminescent layer uses Alq3 as a host. A dopant including 2% of a chemical substance specified by the formula 7 below and 10% of rubrene is used to dope the layer.

The green block 24 of the luminescent layer uses Alq3 as a host. A dopant including 1% of a quinacridone derivative and 10% of tert-butyl-substituted-dinaphtyl-anthracene is used to dope the layer.

The blue block 26 of the luminescent layer uses a tert-butyl-substituted-dinaphtyl-anthracene as a host. A dopant including 2% of tert-butyl-substituted-perylene (TBP) is used to dope the layer. The thickness of the red block 22 of the luminescent layer, the green block 24 of the luminescent layer and the blue block 26 of the luminescent layer is 37.5 nm. The electron transporting layer 28 of a thickness of 37.5 nm is formed on top of the blocks of the luminescent layer.

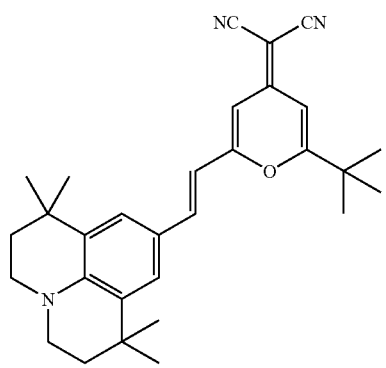

-continued

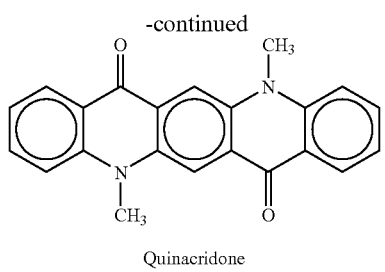

Quinacridone

FIG. 4 shows a variation in percentage in the luminance of organic EL devices after a lapse of 100 hours and 500 hours, assuming that the luminance at the initial stage is 100%. For example, the luminance of red, green and blue organic EL devices after a lapse of 500 hours is 89, 91 and 90%, respectively, showing that white balance is substantially maintained. Thus, by combining red, green and blue blocks of the luminescent layer formed of the materials as described above, the problem of coloration with time of the display apparatus is overcome.

In order to produce the above-described organic EL device of a layered structure in which the boundaries between the blocks of the luminescent layer are provided on the second insulating layer 18, each block of the luminescent layer and the corresponding block of the electron transporting layer 28 are formed as a pair, a luminescent layer block for one color being formed in a chamber different from that of the other colors in a multi-chamber organic EL device manufacturing apparatus. That is, for example, the red block 22 of the luminescent layer and the electron transporting layer 28 are successively formed in a given chamber. The operation then moves on to the next chamber where the green block 24 of the luminescent layer and the electron transporting layer 28 are formed in succession. Similarly, the operation moves to the next chamber where the blue block 26 of the luminescent layer and the electron transporting layer 28 are formed in succession. With this, cross contamination of dopants observed in the related art when the three blocks of the luminescent layer are formed in the same chamber is avoided.

Figure 5:
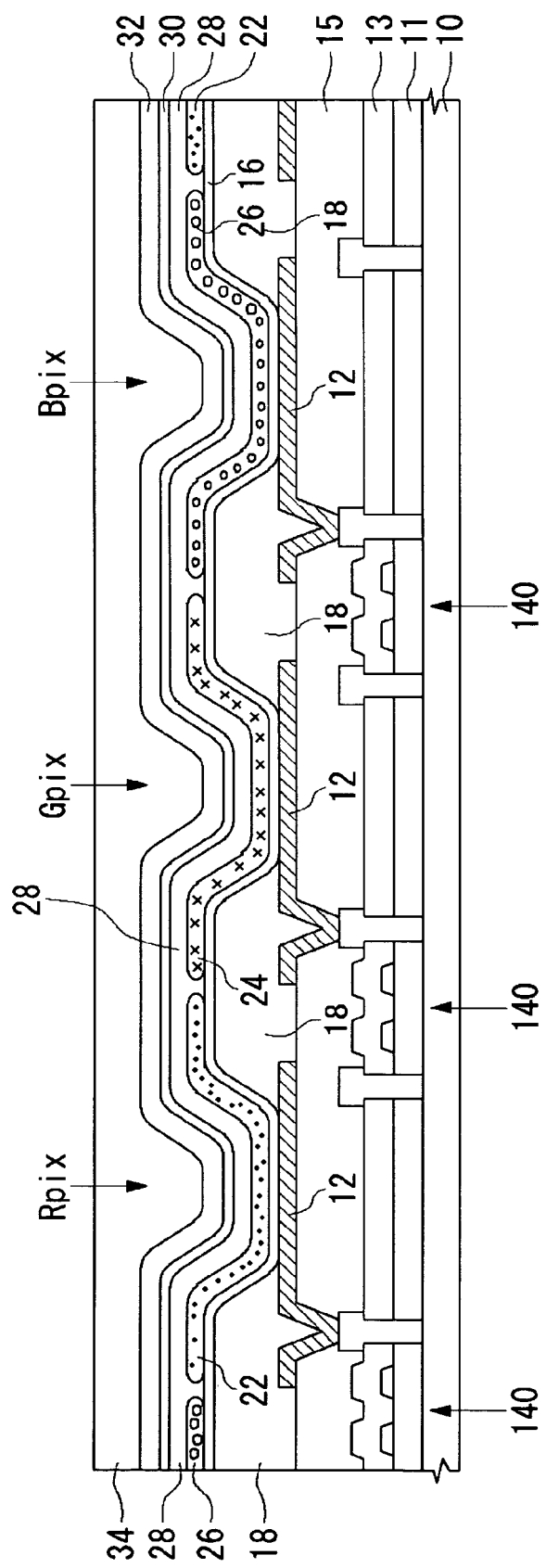
FIG. 5 is a section view of a structure of three organic EL devices producing red, green and blue lights according to a variation of the embodiment, wherein an electron transporting layer is seamlessly formed on the three luminescent layers.

While FIG. 2 shows a section of the organic EL display apparatus in which the blocks of the electron transporting layers 28 independent of each other are formed on the respective three blocks of the luminescent layer, the structure need not be limited to this. For example, as shown in FIG. 5, the electron transporting layer 28 may be formed to cover the entirety of the three blocks of the luminescent layer seamlessly.

As described above, according to the embodiment, effects on the display occurring when the position of the luminescent layer is displaced in the process of formation are canceled, by disposing the boundaries between the blocks of the luminescent layer on the second insulating layer 18. The second TFT 140 is formed beneath the second insulating layer 18. Normally, an organic EL device does not produce any light in a region formed on the second insulating layer 18 in which the hole injection electrode 12 is not provided. Accordingly, displacement in the position occurring in the process of forming the luminescent layer on the second insulating layer 18 does not affect an end product since no outside projection of light is produced. Therefore, defects in products caused by displacement in the position of luminescent layer are decreased so that the yield of products is improved.

Further, by forming the blocks of respective colors of the luminescent layer and the associated blocks of the electronic transporting layer above in succession, cross contamination of materials occurring in the luminescent layer in the related art is controlled.

INDUSTRIAL APPLICABILITY

As described, the present invention is applicable to an organic electroluminescence display apparatus and a method of manufacturing the same.

What is claimed is:

1. An organic electroluminescence display apparatus having plurality of organic electroluminescence devices adjacent to each other, comprising:
    an active element on a substrate to drive the organic electroluminescence devices;
    a first insulating layer to cover the substrate and the active element;
    a respective anode at a predetermined region in the first insulating layer for each organic electroluminescence device,;
    a second insulating layer at a predetermined region above the first insulating layer and the anode so as to cover a vicinity of the respective anode;
    a hole transporting layer formed across adjacent organic electroluminescent devices so as to cover the anode and the second insulating layer entirely;
    a luminescent layer for each of the organic electroluminescence devices on a predetermined region of the hole transporting layer;
    an electron transporting layer for each of the organic electroluminescence devices on the luminescent layer;
    a lithium fluoride layer formed across adjacent organic electroluminescence devices so as to cover the electron transporting layer entirely; and
    a cathode formed across adjacent organic electroluminescence devices so as to cover the lithium fluoride layer entirely,
    wherein a first boundary between adjacent blocks of the luminescent layer and a second boundary between adjacent blocks of the electron transporting layer are in contact with the lithium fluoride layer above the second insulating layer, wherein the first and second boundaries are located between adjacent organic electroluminescence devices.

2. The organic electroluminescence display apparatus according to claim 1 wherein the electron transporting layer is formed seamlessly on the blocks of the luminescent layer.

3. The organic electroluminescence display apparatus according to claim 1 wherein the electron transporting layer comprising blocks is built on the luminescent layer, and the second boundary between the adjacent blocks of the electron transporting layers is vertically aligned with the first boundary.

4. A method of manufacturing an organic electroluminescence display apparatus provided with a plurality of organic electroluminescence devices formed to be adjacent to each other, comprising:
    forming an active element driving the organic electroluminescence devices on a predetermined region of a substrate;
    forming a first insulating layer to cover the substrate and the active element;
    forming an anode at a predetermined region in the first insulating layer;

forming a second insulating layer above the active element and in a predetermined region on the first insulating layer and the anode;

forming a hole transporting layer to cover the first insulating layer, the second insulating layer, and the anode;

forming a luminescent layer comprising blocks adjacent to each other, in a predetermined region on the hole transporting layer; and forming an electron transporting layer comprising blocks on the luminescent layer, wherein a first boundary between the adjacent blocks of the luminescent layer is provided on the second insulating layer, and wherein a second boundary between the adjacent blocks of the electron transporting layer is vertically aligned with the first boundary.

5. The method of manufacturing an organic electroluminescence display apparatus according to claim 4 wherein forming the luminescent layer and forming the electron transporting layer are performed successively for a pixel producing a given color.

6. The method of manufacturing an organic electroluminescence display apparatus according to claim 4 wherein the active element is a thin film transistor.

* * * * *